(12) United States Patent
Boonekamp (10) Patent No.: US 11,294,104 B2
(45) Date of Patent: Apr. 5, 2022

(54) OPTICAL OUTPUT SYSTEM AND LIGHTING UNIT COMPRISING THE SYSTEM

(71) Applicant: SIGNIFY HOLDING B.V., Eindhoven (NL)

(72) Inventor: Erik Paul Boonekamp, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 16/493,042

(22) PCT Filed: Mar. 27, 2018

(86) PCT No.: PCT/EP2018/057716
§ 371 (c)(1),
(2) Date: Sep. 11, 2019

(87) PCT Pub. No.: WO2018/184905
PCT Pub. Date: Oct. 11, 2018

(65) Prior Publication Data
US 2020/0018873 A1    Jan. 16, 2020

(30) Foreign Application Priority Data

Apr. 3, 2017    (EP) .................................... 17164536

(51) Int. Cl.
*G02B 3/00* (2006.01)
*F21V 5/00* (2018.01)
(Continued)

(52) U.S. Cl.
CPC ............ *G02B 3/0056* (2013.01); *F21V 5/004* (2013.01); *F21V 5/04* (2013.01); *G02B 3/0062* (2013.01);
(Continued)

(58) Field of Classification Search
CPC ....... F21V 5/004; F21V 5/04; G02B 19/0014; H01L 33/58
See application file for complete search history.

(56) References Cited

U.S. PATENT DOCUMENTS 5,187,599 A * 2/1993 Nakanishi ......... G02F 1/133526
    349/95
5,548,450 A    8/1996 Kang
(Continued)

FOREIGN PATENT DOCUMENTS

CN         1938615 A      3/2007
CN       109923443 A      6/2019
(Continued)

OTHER PUBLICATIONS

J. Chaves, "Inhomogeneous Source Uniformization Using a Shell Mixer Kohler Integrator", Optical Systems Design, Dec. 18, 2012, Proc. of SPIE, vol. 8550, pp. 1-12.
(Continued)

*Primary Examiner* — Zheng Song
(74) *Attorney, Agent, or Firm* — Daniel J. Piotrowski (57) ABSTRACT

An optical output system for an LED light source has a pair of lens arrays (40, 42) with a narrow air gap (48) between the lens arrays (40, 42). The optical system provides an optical integration function for light mixing, and the air gap (48) enables a uniform wide-beam output to be provided even for incident light from a wide range of angles, for example as received from a non-collimated light source.

15 Claims, 8 Drawing Sheets

(51) Int. Cl.
*F21V 5/04* (2006.01)
*G02B 19/00* (2006.01)
*H01L 33/58* (2010.01)

(52) U.S. Cl.
CPC .......... *G02B 19/0061* (2013.01); *H01L 33/58* (2013.01)

(56) References Cited

U.S. PATENT DOCUMENTS

| | | | | |
|---|---|---|---|---|
| 6,069,739 | A * | 5/2000 | Borodovsky | G02B 3/0056 355/67 |
| 6,507,441 | B1 | 1/2003 | Eisenberg et al. | |
| 2010/0039819 | A1* | 2/2010 | Fournier | G02B 26/0875 362/268 |
| 2010/0157428 | A1* | 6/2010 | Wu | G02B 3/0031 359/622 |
| 2010/0290234 | A1* | 11/2010 | Bierhuizen | F21V 5/04 362/311.02 |
| 2010/0309665 | A1* | 12/2010 | Young | F21V 14/06 362/235 |
| 2011/0075107 | A1 | 3/2011 | Teijido et al. | |
| 2011/0259394 | A1* | 10/2011 | Krasnov | C03B 18/14 136/246 |
| 2013/0003415 | A1* | 1/2013 | Park | G02B 6/0043 362/627 |
| 2013/0320075 | A1* | 12/2013 | Park | B65D 5/526 229/117.13 |
| 2015/0167935 | A1* | 6/2015 | Beghelli | F21V 7/06 362/268 |
| 2016/0181310 | A1 | 6/2016 | Pitts et al. | |
| 2016/0364836 | A1* | 12/2016 | Sumi | G06F 3/013 |
| 2017/0146204 | A1* | 5/2017 | Di Trapani | G02B 19/0066 |
| 2017/0153004 | A1* | 6/2017 | De Zwart | G02B 3/0062 |
| 2017/0261748 | A1* | 9/2017 | Powell | G02B 17/08 |
| 2017/0317251 | A1* | 11/2017 | Sweegers | H01L 33/46 |
| 2018/0017717 | A1* | 1/2018 | Dross | G02B 19/0028 |

FOREIGN PATENT DOCUMENTS

| | | |
|---|---|---|
| CN | 209029374 U | 6/2019 |
| CN | 112567648 A | 3/2021 |
| EP | 0811221 A2 | 12/1997 |
| EP | 3143450 A1 | 3/2017 |
| WO | 2005083317 A1 | 9/2005 |
| WO | 2016066476 A1 | 5/2016 |
| WO | 2016071063 A1 | 5/2016 |
| WO | 2016116290 A1 | 7/2016 |

OTHER PUBLICATIONS

Oliver Dross, "Kohler Integration in Color Mixing Collimators", 14th International Conference on Solid State Lighting and LED-Based Illumination Systems, Proc. of SPIE, vol. 9571, 2015, pp. 1-17.

O. Dross, et al., "Kohler Integrators Embedded into Illumination Optics Add Functionality", Proceedings of SPIE—The International Society for Optical Engineering 7103, Sep. 2008, pp. 1-12.

* cited by examiner $p = 2R\sin\alpha$ $x = R(1-\cos\alpha)$ $v = R*\sin(\alpha) * \tan\left(\arcsin\left(\frac{\sin\alpha}{n}\right) + \frac{\pi}{2} - \alpha\right) - R(1-\cos\alpha)$ $\psi = \arcsin\left(n*\sin\left(\arctan\left(\frac{1}{\tan\left(\arcsin\left(\frac{\sin\alpha}{n}\right) + \frac{\pi}{2} - \alpha\right)}\right)\right)\right)$

OPTICAL OUTPUT SYSTEM AND LIGHTING UNIT COMPRISING THE SYSTEM

CROSS-REFERENCE TO PRIOR APPLICATIONS

This application is the U.S. National Phase application under 35 U.S.C. § 371 of International Application No. PCT/EP2018/057716, filed on Mar. 27, 2018, which claims the benefit of European Patent Application No. 17164536.9, filed on Apr. 3, 2017. These applications are hereby incorporated by reference herein.

FIELD OF THE INVENTION

This invention relates to an optical output system, for example for processing the output of an LED light source.

BACKGROUND OF THE INVENTION

LED luminaires are well known, in which an LED light source (of one or more LEDs) is provided inside a housing, and a light output panel is provided in front of the light source inside the luminaire.

It is known to provide the light output panel with a profiled surface in order to prevent transmitted light from radiating in undesired directions. The light output panel is for example a plate of plastic or any other material such as polymethyl methacrylate (PMMA) or polycarbonate (PC).

The purpose of the panel is to ensure that transmitted light radiates from the panel in the desired directions. Furthermore, the panel may be used to provide color mixing and to reduce image artefacts caused by the light source.

One approach for providing color mixing is to make use of an array of lenslets, for example a stack of two lenslet arrays. One particular approach is to make use of so-called Kohler integration, as for example described in Dross, O. "Kohler Integration in Color Mixing Collimators", Proc. Of SPIE Vol. 9571 957109, 2015.

Kohler integration is a powerful concept to create a uniform and color mixed beam from an array of sources of various emission colors, or else to provide light mixing from a non-uniform single source.

Figure 1:
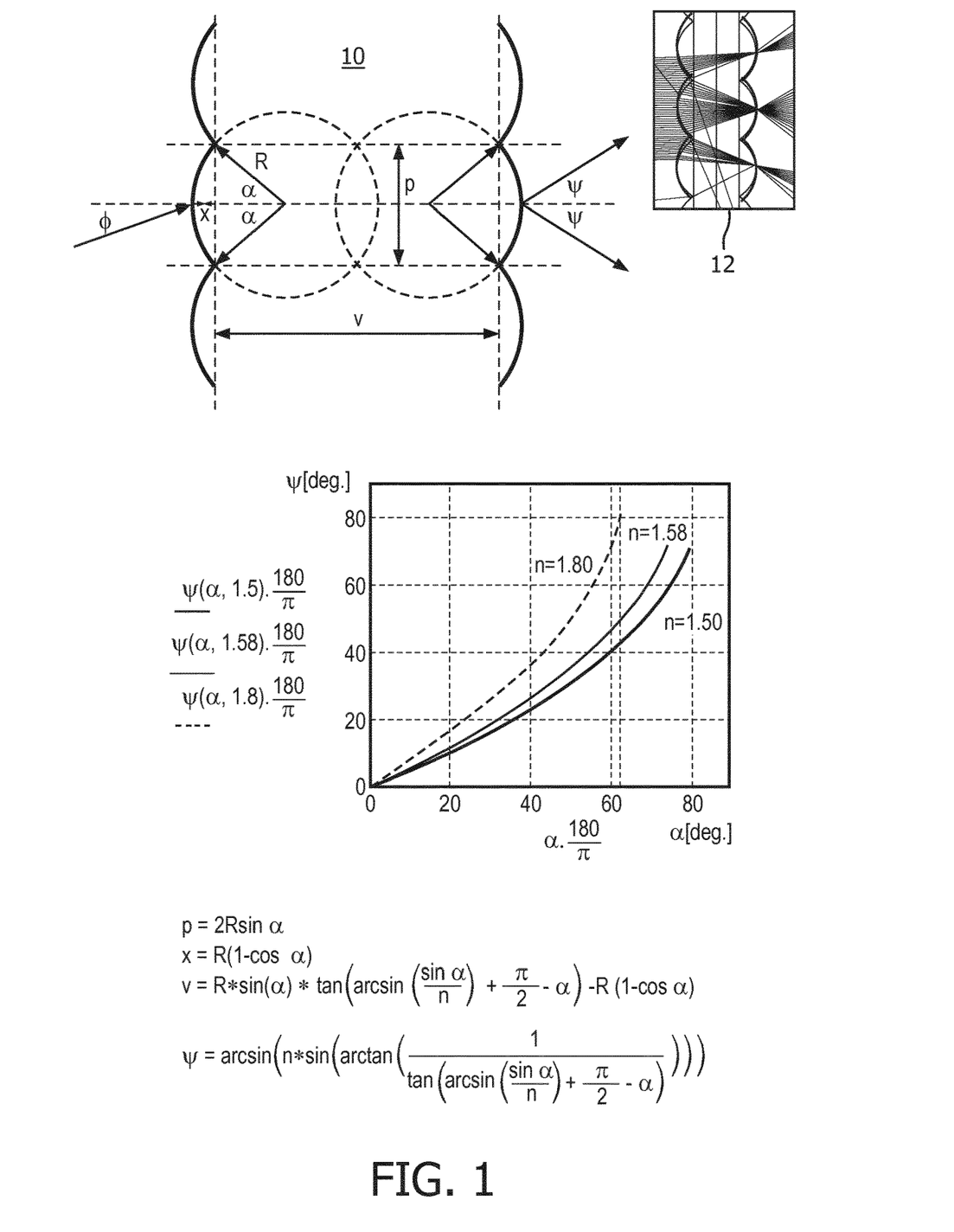
FIG. 1 shows a typical example of a Kohler integrator formed as a linear lenslet array, as well as equations and a graph illustrating the relationship between the range of incident angles and the range of exit angles.

A typical example of a Kohler integrator is a linear lenslet array as depicted in FIG. 1. The integrator comprises a lens body 10 formed of a polymer, such as PMMA with a refractive index of 1.5. The two opposing surfaces each have an array of aligned microlenses, with a pitch p, lens radius R, and angle from the spherical lens center of $+/-\alpha$ as shown. The lenses are convex, i.e. they each curve outwardly from the middle of the lens body 10. In between the lenses of a single plate pockets are present. The overall thickness v of the combined two lens plates being the (normal, shortest) distance between the lens pockets of the first lens array and the lens pockets of the second lens array, This type of integrator is characterized by an angle $\psi$. When the incoming beam has a maximum angle $\phi$, the light of the outgoing beam is distributed uniformly over an angular range of $2\psi$ when $\phi<\psi$.

The function of the integrator for a collimated light input is shown in pane 12. The first lenslet array focuses to the surface of the second lenslet array, and from this surface a wide angle beam is emitted.

The bottom part of FIG. 1 shows geometric equations to enable construction of a linear lenslet array with the required value for $\psi$. The graph shows how the refractive index influences the relationship between the lens parameter a, and the output angle $\psi$ based on the equation shown.

Figure 2:
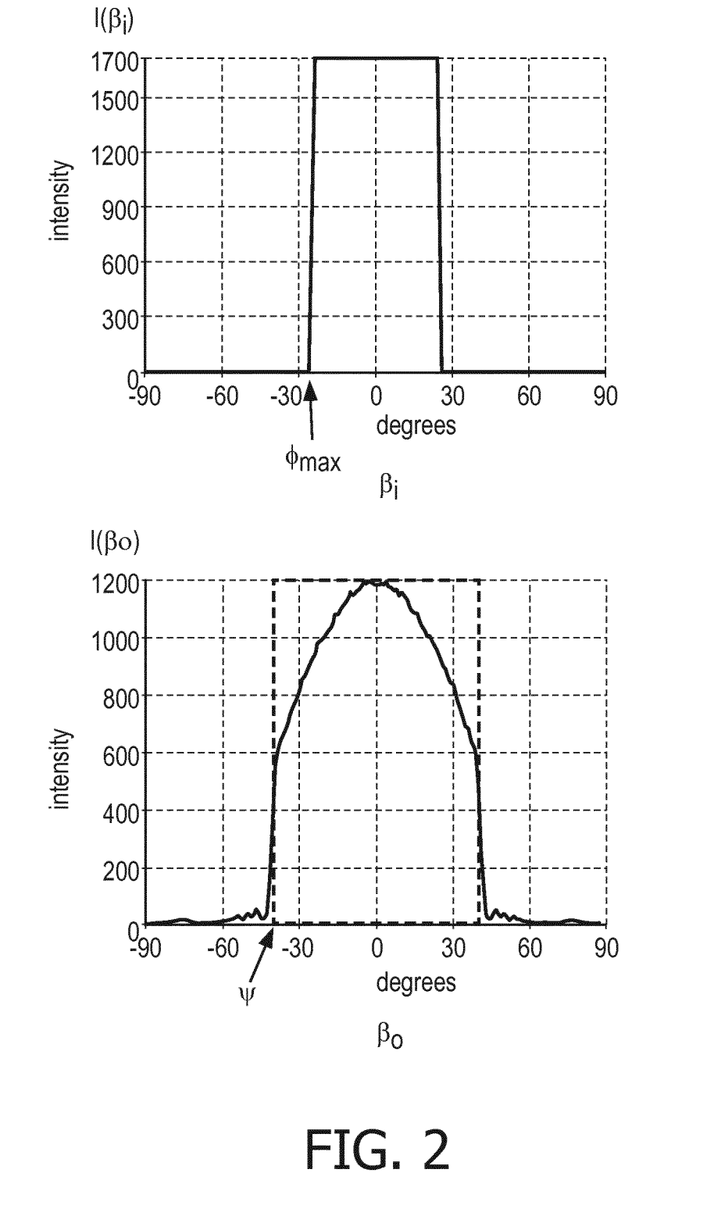
FIG. 2 shows an intensity versus angle plot for a confined incident beam and for an exit beam for a design based on FIG. 1.

FIG. 2 shows an intensity versus angle plot for an incident beam with full wave half maximum (FWHM) of 50 degrees (i.e. $\phi=25$ degrees and all light is confined to this range) as the left plot, and shows the intensity versus angle plot for the exit beam for a lenslet surface with $\psi=40$ degrees (so that FWHM=80 degrees).

The input parameters of this linear Kohler integrator are: n=1.50 (refractive index), R=0.5 mm and $\psi=40$ degrees. The calculated values for $\alpha$, v, p and x are: $\alpha=61.1$ degrees, v=0.665 mm, p=0.875 mm and x=0.258 mm.

FIG. 2 shows that all light of the incident beam is distributed and hence mixed in an angular range of 80 degrees ($2\psi$).

Figure 3:
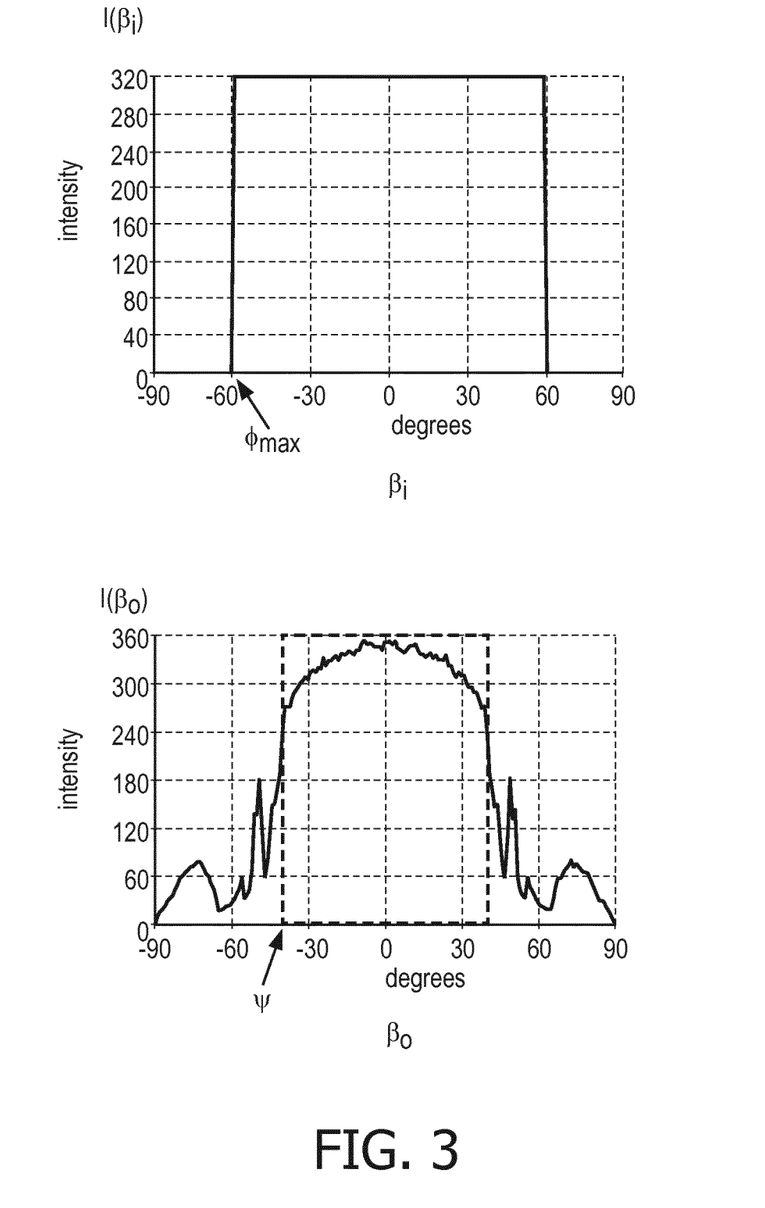
FIG. 3 shows the plots of FIG. 2 if the input light is not confined to a required narrow angular range.

FIG. 3 shows the situation if the input light is not confined to the required narrow angular range.

FIG. 3 shows an intensity versus angle plot for an incident beam with FWHM=120 degrees (i.e. $\phi=60$ degrees) as the left plot, and shows the intensity versus angle plot for the exit beam for the same lenslet surface with $\psi=40$ degrees.

When $\phi>\psi$ as shown in FIG. 3, light escapes from the lens array in all directions. Light escaping at angles$>\psi$ is not mixed and may give artefacts (such as color artefacts because of reduced color mixing) on the target surface, such as a floor or wall.

This means that light should be collimated before it enters the Kohler lenslet plate to avoid these artefacts. Additional optics is thus needed and this gives an optical system with an undesired high volume/size and high cost.

There is therefore a need for an optical system which enables control of an output beam angle, with good light mixing, and which can be achieved with low cost and low weight optical components.

SUMMARY OF THE INVENTION

The invention is defined by the claims.

According to examples in accordance with an aspect of the invention, there is provided an optical output system for an LED light source provided at a light source location, comprising:

a first array of lenses, comprising convex lenses facing the light source location; and a second array of lenses, on the opposite side of the first array of lenses to the light source location, and comprising convex lenses facing away from the light source location, wherein there is an air gap between the first and second arrays of lenses, wherein the thickness of the air gap is less than 10% of the maximum thickness between the outer surfaces of the first and second arrays of lenses.

Preferably, an overall thickness of the first and second array of lenses is equal or less than a lens pitch of the second lens array as thus a further improved optical output system is obtained in that cross-talk is further counteracted or reduced. Alternatively or additionally, the optical output system properties can be tuned by choosing the position of the gap, in dependence on the desired quality of the optical output system. Preferably, the gap is positioned at the most 25% of the overall thickness away from either the first or second lens array.

This output system essentially functions as a Kohler integrator, with two lens arrays facing away from each other. The lenses of the two lens arrays are aligned to form lens pairs. However, the provision of the air gap means that the integration function is operative with diffuse light, in particular without pre-collimation, to enable low-glare wide beams to be formed. The air gap may be considered to function as an angle-selective reflector, which provides a total internal reflection function for incident angles exceeding a critical angle. The optical output system enables a uniform optical exit window to be formed with an attractive appearance.

The air gap is narrow to prevent that refracted light beams from a lens in the first lens array are able to pass to a lens in the second lens array which is not the paired lens. The air gap for example has a thickness of less than 0.1 mm, for example less than 0.05 mm, for example as thin as 0.01 mm.

The maximum thickness v between the (pocket) surfaces of the first and second arrays of lenses may be between 0.3 mm and 5 mm. This enables a low cost and low weight lens system to be formed. However, the design may be scaled to different dimensions.

The lenses of each lens array are for example arranged with a pitch of between 300 μm to 5 mm, for example 300 μm to 500 μm for a microscale system, or 0.8 mm to 5 mm for a mm scale system.

The lenses of each lens array may be arranged in a hexagonal grid. The lenses of the first and second lens arrays preferably have the same lens pitch to form aligned lens pairs.

A focal point of each lens of the first array of lenses is preferably at or near the surface of the second array of lenses. This defines the conventional Kohler configuration.

The air gap is preferably flat. Each lens array may have a flat surface at one side which forms one side of the air gap, and the textured lens surface at the opposite side. This generally means the two lens arrays are flat (i.e. the lenses project from a common plane). However, the gap could extend at an acute angle with the common (flat) plane of the lens arrays, and/or the outer surface could be (inwardly/outwardly) curved with the lenses not projecting from a common plane but still with mutual focal points. Also, the system may be non-flat if the aesthetic design of a lighting system requires a non-flat light output surface.

The air gap may be exactly in the middle of the two lens arrays as then the two lens arrays may be formed as identical plates, for example made by injection molding. Yet alternatively, the air gap may be positioned closer to either one of the first and second lens arrays. The gap being positioned closer to the first lens array facing the light source, for example at the most 25% of the thickness v away from the first lens array, has the advantage that in case the two lens plates are made with of materials having a mutually different refractive index to attain a desired optical effect, this optical effect is more prominent, i.e. more amplified than in the case the gap is positioned closer to the second lens array. On the other hand, if the gap is positioned closer to the second lens array, for example at least 75% of the thickness v away from the first lens array, the optical output system is less sensible to distortions, for example surface roughness or contaminations, of/in the gap.

The invention also provides a lighting unit comprising:
an optical output system as defined above; and
a light source at the light source location.

The light source for example comprises an LED or an LED arrangement. The light output may be provided directly to the optical output system without any intervening collimator. The or each LED for example has a Lambertian light output intensity distribution. Chip on board LEDs may be used for a low cost implementation.

The lighting unit may for example have a full wave half maximum output angle of between 80 and 100 degrees. This provides a wide angle output beam, with good light mixing provided by the lens arrangement.

The lighting unit may comprise a housing having reflective side walls and a reflective base, wherein the light source is provided on the base, and the optical output system is provided over the top of the side walls. This defines a light box structure, which enables high efficiency light output.

BRIEF DESCRIPTION OF THE DRAWINGS

Examples of the invention will now be described in detail with reference to the accompanying drawings, in which.

DETAILED DESCRIPTION OF THE EMBODIMENTS

The invention provides an optical output system for an LED light source which has a pair of lens arrays with a narrow air gap between the lens arrays. The optical system provides an optical integration function for light mixing, and the air gap enables a uniform wide beam output to be provided even for incident light from a wide range of angles, for example as received from a non-collimated light source.

Figure 4:
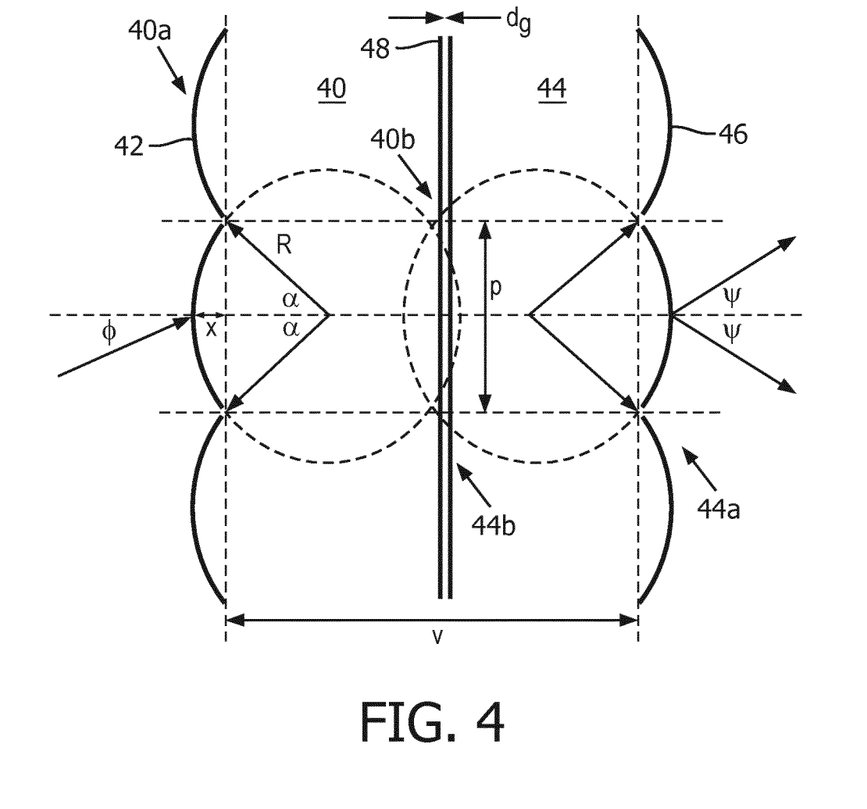
FIG. 4 shows an example of an optical output system in accordance with the invention.

FIG. 4 shows an example of the output system.

A first array 40 of lenses comprises convex lenses 42 facing the incident light, namely facing a light source location. A second array 44 of lenses is on the opposite side of the first array of lenses to the light source location, and comprises convex lenses 46 facing away from the light source location. The first lens array 40 has an outer surface 40a which defines the lens shapes and an inner surface 40b which is flat. The second lens array 44 has an outer surface 44a which defines the lens shapes and an inner surface 44b which is flat.

The two lens arrays are surrounded by air, and there is also an air gap 48 between the first and second arrays 42, 46, between the inner surfaces 40b, 44b. The thickness of the air gap $d_g$ is less than 10% of the maximum thickness between the outer surfaces of the first and second arrays 42, 46 of lenses. Thus, for the parameters shown the air gap width is less than $0.1(v+2x)$.

The two lens arrays function as a Kohler integrator but with a modified optical function provided by the air gap. The lenses of the two lens arrays are thus aligned to form lens pairs. The air gap is narrow to prevent that refracted light beams from a lens in the first lens array is able to pass to a lens in the second lens array which is not the paired lens. The air gap for example has a thickness of less than 0.1 mm, for example less than 0.05 mm, for example as thin as 0.01 mm.

The dimensional parameters are shown in FIG. 4, which correspond to those shown in FIG. 1.

The air gap may be exactly in the middle of the two lens arrays. In this case, the two lens arrays may be formed as identical plates, for example made by injection molding.

Figure 5:
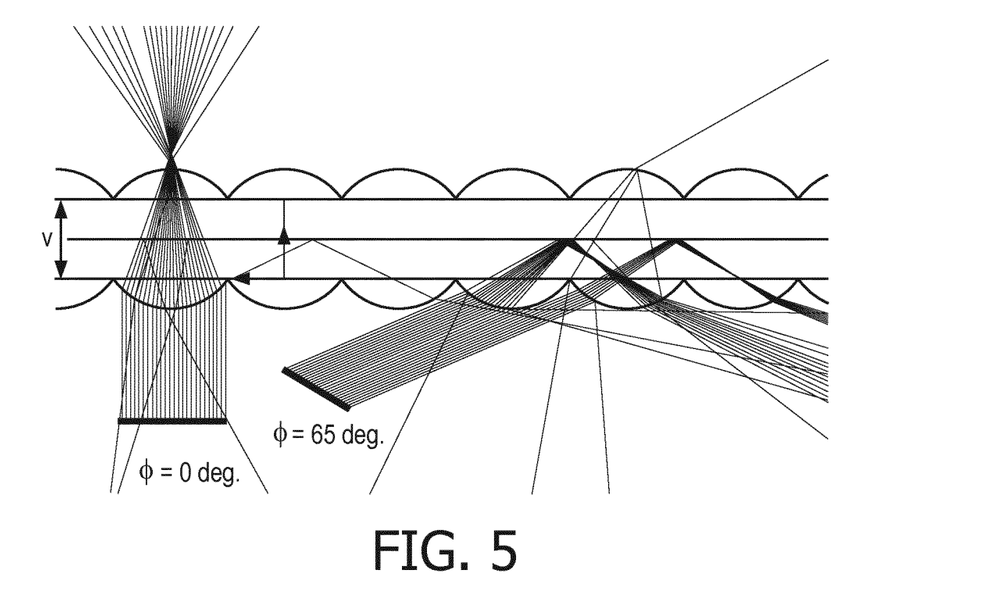
FIG. 5 shows some examples of light paths through the structure of FIG. 4.

Some examples of light paths are shown in FIG. 5. A first set of light paths is shown as a parallel beam at a normal angle of incidence ($\varphi=0$) and a second set of light paths is shown as a parallel beam at a large angle of incidence ($\varphi=65$ degrees).

The perpendicular incident rays are easily transmitted through the entire double layer structure with a transmission of more than 90%. Incoming rays with an angle larger than about 60 degrees have a very low transmittance and consequently a high reflectance by total internal reflection of the light rays at the air gap. The high angles can be recycled in the optical system by providing diffuse scattering, for example at side walls and a base of a light box design. The final result is a beam shape with a very limited intensity at the high angles. The design is especially suitable for wide beam designs (with FWHM between 80 and 100 degrees).

The air gap thus means that the integration function is operative with diffuse light, in particular without pre-collimation, to enable low-glare wide beams to be formed. The optical system enables a uniform optical exit window to be formed with an attractive appearance.

Figure 6:
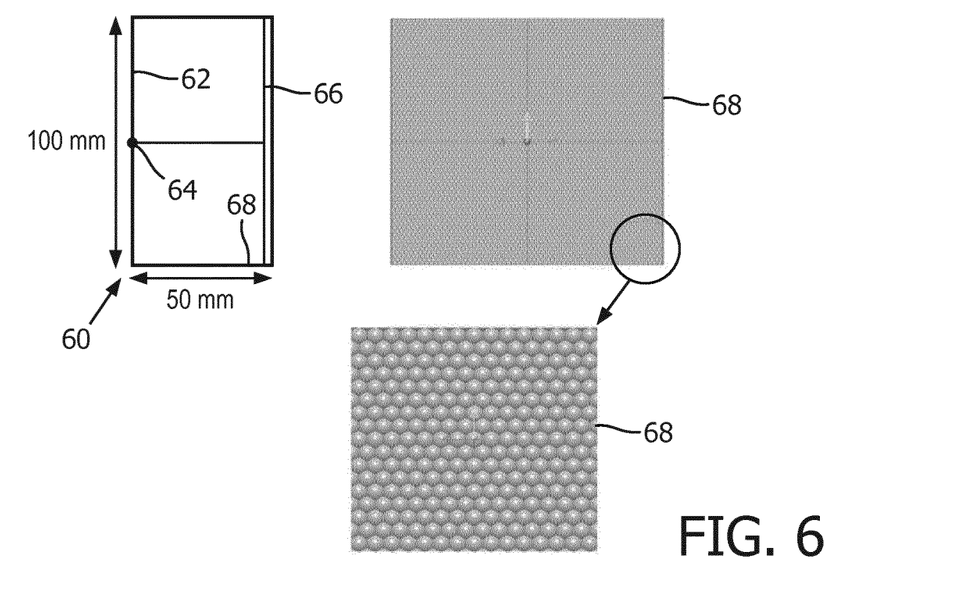
FIG. 6 shows a light box using the optical output system of FIG. 5.
Figure 7A:
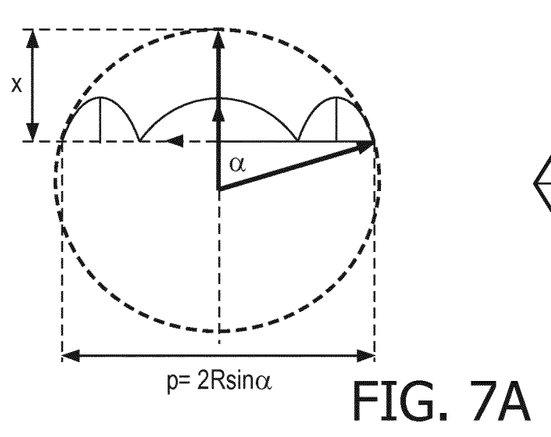
FIGS. 7A-D show-one possible lenslet design.
Figure 7B:
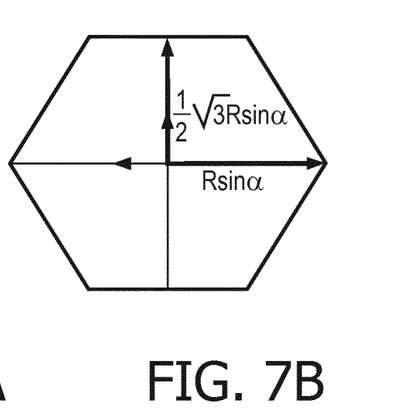
Figure 7C:
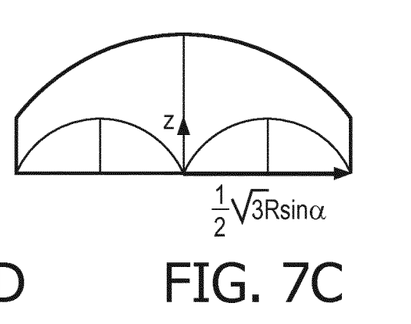
Figure 7D:
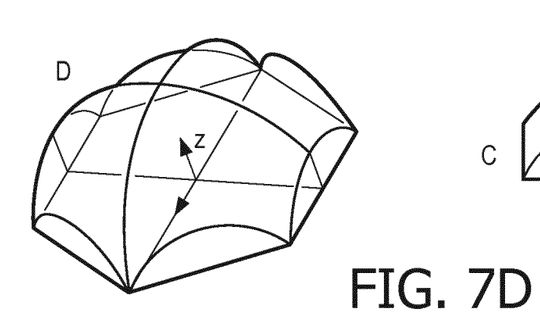

The lens arrays may be formed as linear structures. Thus, while FIG. 5 (and FIG. 6 show) an array of 3D lenses, the lenses may be 2D, by which is meant that they are extruded linear structures having a constant cross section along their length. The beam shaping or color mixing is then only in one direction whereas a 3D structure is able to control the beam shape in all directions.

FIG. 6 shows a simple light box comprising a base 62 with an LED light source 64 at the center, side walls 66 and the optical system 68 as described above forming a light exit window. A side view is shown to the left and a top view is shown to the right.

The base and side walls have diffuse reflective surfaces (for example white). The light box may contain only a single LED, for example of 2 mm×2 mm with a Lambertian emission profile. However, an array of LEDs may be used, of one color or of multiple colors. The LED light output is provided directly to the optical output system 68 without any intervening collimator. Chip on board LEDs may be used for a low cost implementation.

The lenses of the light exit window 68 are tessellated, and for this purpose hexagonally shaped lenslets may be used forming a hexagonal grid. The lenses of the first and second lens arrays preferably have the same lens pitch to form aligned lens pairs and this means identical lens arrays may be used.

FIG. 7 shows one possible lenslet design, for example for a first array of lenslets. FIG. 7A shows a first side view (showing one hexagonal face full on and two other faces from an angle), FIG. 7B shows a plan view, FIG. 7C shows a second side view (showing two hexagonal faces not full on) and FIG. 7D shows a perspective view.

Each lens has a spherical lens surface (with radius R) which is truncated in plan view into a hexagonal shape.

The geometry of the hexagons in this example is defined using the parameters: n=1.50 (refractive index), R=1.0 mm and ψ=60 degrees. These parameters are used to calculate α, v, p and x giving the results:

α=75.5 degrees
v=0.620 mm
p=1.936 mm
x=0.749 mm.

The air gap width is 0.01 mm. From these data it follows that the overall thickness v is less than the pitch p of the lenslets of the first lens array.

Figure 8:
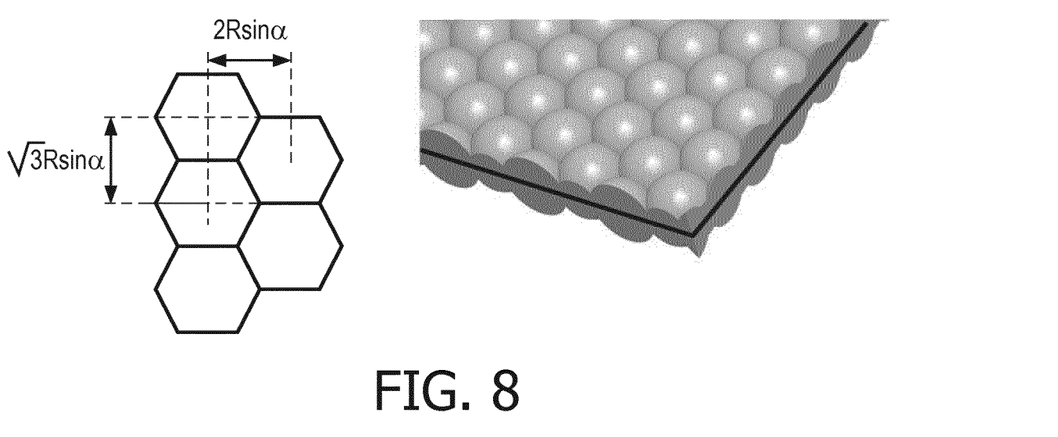
FIG. 8 shows the lens pitch in the two orthogonal axes and shows a perspective view of the optical output system.

FIG. 8 shows the lens pitch in the two orthogonal axes and shows a perspective view of the optical output system.

These dimensions give an example of the general scale of one example implementation.

More generally, the maximum thickness between the most outer surfaces of the first and second arrays of lenses (i.e. v+2x) may be between 0.4 mm and 5 mm. This enables a low cost and low weight lens system to be formed. However, the design may be scaled to different dimensions.

The lenses of each lens array are for example arranged with a pitch (as shown in FIG. 8) of between 300 μm and 5 mm, for example 300 μm to 500 μm for a microscale system, or 0.8 mm to 5 mm for a mm scale system. Any size range between these two sub-ranges may also be used.

The overall area of the light output unit is for example in the range 10 cm² to 1000 cm².

Figure 9:
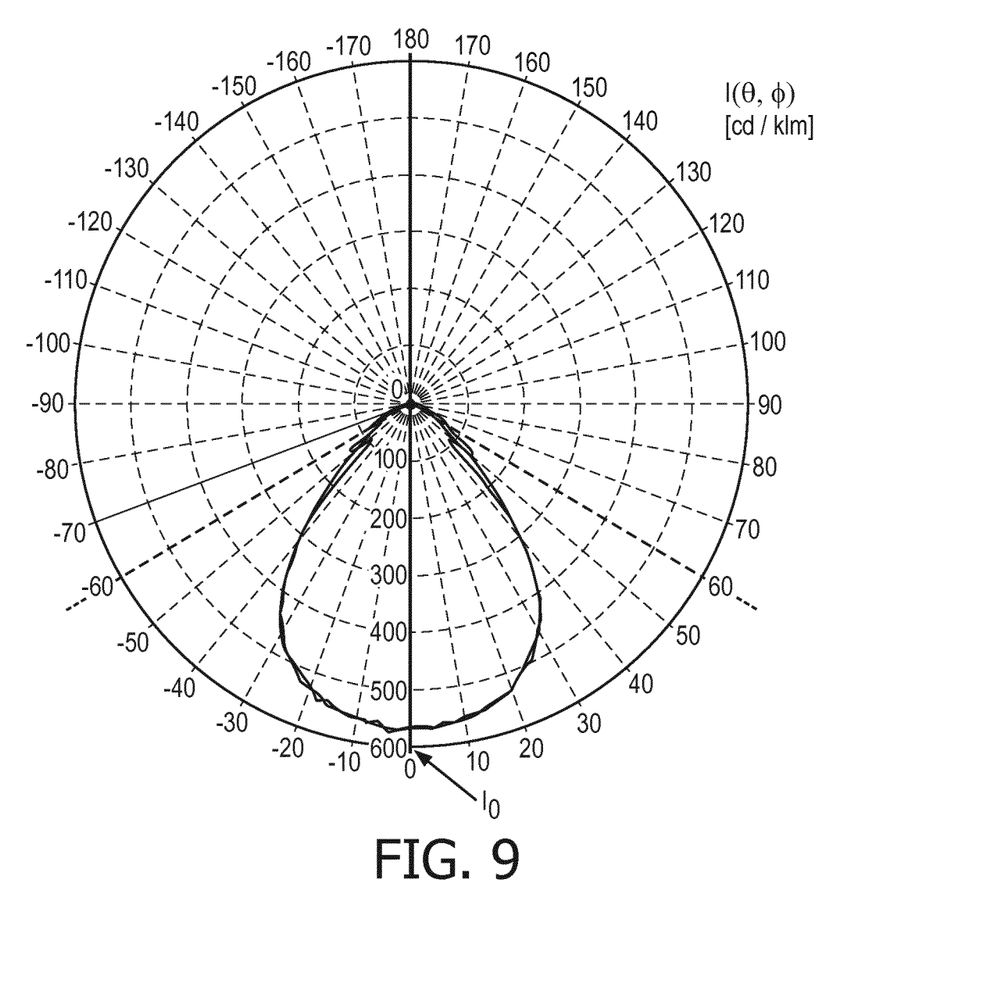
FIG. 9 shows an intensity distribution for the system.

FIG. 9 shows the intensity distribution for the system. There is a peak intensity $I_0$ in the 0 degree angle direction (e.g. vertically down for a light box arranged at a ceiling). Very low intensities (compared to $I_0$) are present for viewing angles larger than around 60 degrees.

Figure 10A:
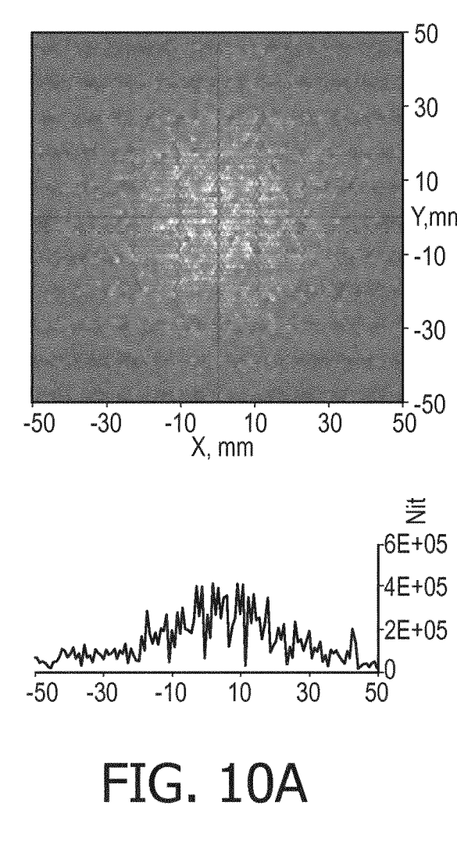
FIGS. 10A-C show the luminance of the full optical window at various viewing angles.
Figure 10B:
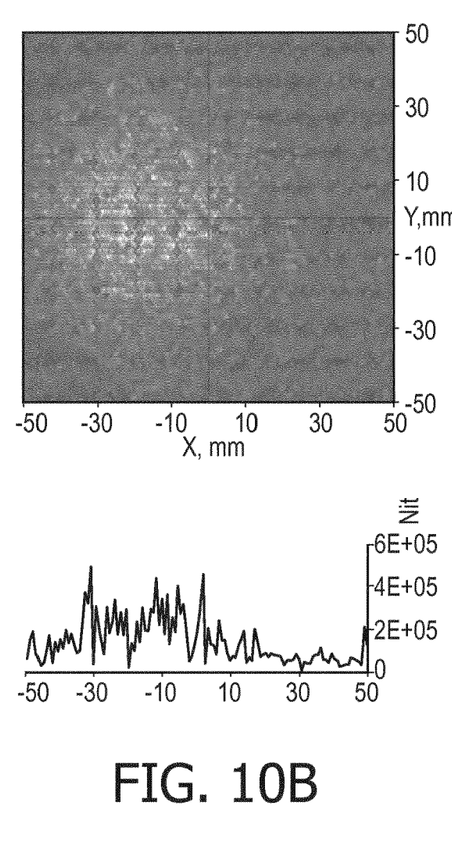
Figure 10C:
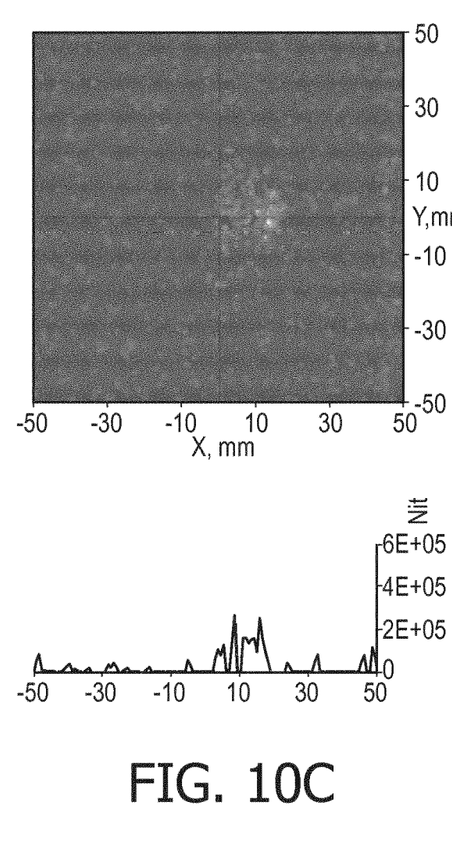

FIG. 10 shows the luminance of the full optical window at various viewing angles.

FIG. 10A shows the luminance at a viewing angle of 0 degrees, FIG. 10B shows the luminance at a viewing angle of 30 degrees and FIG. 10C shows the luminance at a viewing angle of 70 degrees.

A regular dot pattern is visible which gives the impression of a uniform surface illumination.

Figure 11A:
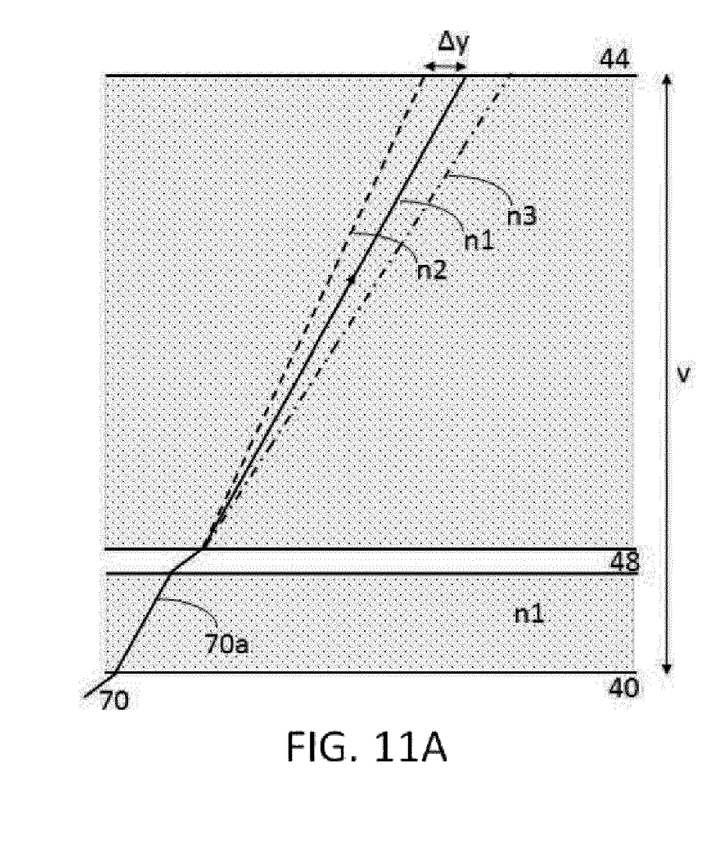
FIGS. 11A-B show the effect on the light ray paths through the structure for different air gap position in the structure and different refractive indices of lens material.
Figure 11B:
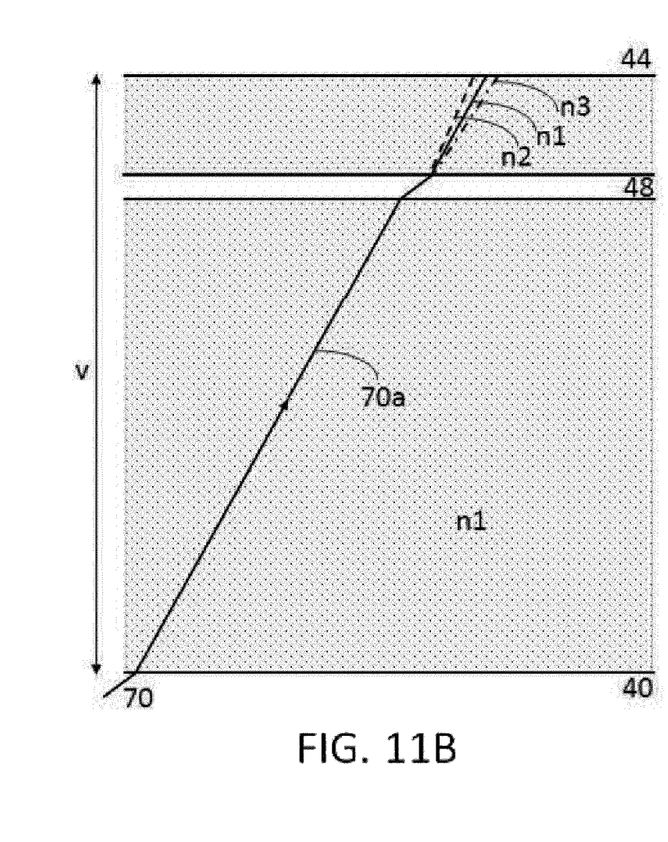

FIGS. 11A-B schematically show the effect on the light ray paths through the structure, comprising first lens array 40 and second lens array 44, for different air gap 48 position in the structure and different refractive indices n1, n2, n3 of lens material. As shown, an un-refracted light ray 70 enter the first lens array 40 having refractive index n1 and propagates as refracted light ray 70a. After crossing the air gap 48 said light ray enters the second lens array, and in dependency of the refractive index of the material of the second lens array is refracted more (i.e. n2>n1), equal (i.e. n1=n1) or less (i.e. n3<n1) than it was refracted by the first lens array. As shown the effect in shifted position Δy of the light ray exiting the second lens array in dependency on the position of the air gap (and refractive indices of the used materials) is evident. In FIG. 11A the air gap is present at less than 25%*v from the first lens array 40, i.e. at about 15%*v, and the effect is enhanced. In FIG. 11B the air gap is present at more than 75%*v from the first lens array 40, i.e. at about 85%*v, and the light ray path is less sensitive to contaminations and/or air gap surface distortions.

The outer shape of the optical output system and hence a light box using the system can have any desired shape.

The lighting system is for example a luminaire for lighting an office or other room, in which case it may be mounted in a recess in the ceiling, or against the surface of the ceiling, or be suspended from the ceiling. The optical output system then forms the lower side of the luminaire, through which side the light radiates from the light source in the luminaire into the office. The light from the luminaire does not only radiate in the vertical downward direction, but also in directions enclosing an angle with the vertical direction to form the desired wide beam. Thus, the luminaire illuminates an area that can be much larger than the dimensions of the luminaire itself. A maximum angle of illumination is also provided to avoid inconvenience for persons at some distance from the luminaire. Thus, multiple luminaires are typically distributed over a ceiling, each luminaire illuminating a portion of the office below the luminaire, while light radiation enclosing a small angle with the surface of the ceiling is avoided.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. An optical output system for an LED light source provided at a light source location, comprising:
   a first array of lenses, comprising a first lens body and convex lenses facing the light source location; and
   a second array of lenses, on the opposite side of the first array of lenses to the light source location, and comprising a second lens body and convex lenses facing away from the light source location,
   wherein there is an air gap between the first and second lens bodies, wherein the thickness of the air gap is less than 10% of the maximum thickness between the outer surfaces of the first and second arrays of lenses, and
   wherein a thickness of the combined first and second lens bodies, being a normal/shortest distance between lens pockets of the first lens array in between the convex lenses and lens pockets of the second lens array in between the convex lenses, is equal or less than a lens pitch of the second lens array and wherein corresponding lenses of the first and second array of lenses have a mutual focal point.

2. A lighting unit comprising:
   an optical output system as claimed in claim 1; and
   a light source at the light source location.

3. A lighting unit as claimed in claim 2, wherein the light source comprises an LED or an arrangement of LEDs.

4. A lighting unit as claimed in claim 3, wherein each LED has a Lambertian light output intensity distribution.

5. A lighting unit as claimed in claim 3, wherein the light source comprises a chip on board LED or LED arrangement.

6. A lighting unit as claimed in claim 2, comprising a housing having reflective side walls and a reflective base, wherein the light source is provided on the base, and the optical output system is provided over the top of the side walls.

7. A system as claimed in claim 1, wherein the air gap has a thickness of less than 0.1 mm.

8. A system as claimed in claim 1, wherein a maximum thickness between the outer surfaces of the first and second arrays of lenses is between 1 mm and 5 mm.

9. A system as claimed in claim 1, wherein the lenses of each array of lenses are arranged with a pitch of between 300 μm to 5 mm.

10. A system as claimed in claim 1, wherein the lenses of each array of lenses are arranged in a hexagonal grid.

11. A system as claimed in claim 1, wherein the lenses of the first and second arrays of lenses have a same lens pitch.

12. A system as claimed in claim 1, wherein a focal point of each lens of the first array of lenses is at the vicinity of the outer surface of the second array of lenses.

13. A system as claimed in claim 1, wherein the air gap is flat.

14. A system as claimed in claim 1, wherein the air gap is positioned at the most 25% of the overall thickness away from either the first or second lens array.

15. The system as claimed in claim 1, wherein the first and second lens body has a thickness of greater than 0.

* * * * *